United States Patent
Lin et al.

(10) Patent No.: US 11,223,199 B2
(45) Date of Patent: Jan. 11, 2022

(54) OVER CURRENT PROTECTION SYSTEM HAVING HIGH OPERATIONAL ENDURANCE AND CAPABLE OF STABILIZING VOLTAGES

(71) Applicant: BENQ CORPORATION, Taipei (TW)

(72) Inventors: Hsin-Nan Lin, Taipei (TW); Chung-Yu Huang, Taipei (TW)

(73) Assignee: BenQ Corporation, Taipei (TW)

( * ) Notice: Subject to any disclaimer, the term of this patent is extended or adjusted under 35 U.S.C. 154(b) by 0 days.

(21) Appl. No.: 15/931,550

(22) Filed: May 13, 2020

(65) Prior Publication Data

US 2020/0366090 A1    Nov. 19, 2020

(30) Foreign Application Priority Data

May 17, 2019    (TW) .................................. 108117094

(51) Int. Cl.
*H02H 9/04*    (2006.01)
*H01L 27/02*    (2006.01)

(52) U.S. Cl.
CPC ......... *H02H 9/046* (2013.01); *H01L 27/0288* (2013.01)

(58) Field of Classification Search
CPC ..... H02H 9/046; H02H 9/042; H01L 27/0288
USPC ......................................................... 361/56
See application file for complete search history.

(56) References Cited

U.S. PATENT DOCUMENTS

| 4,930,036 | A | 5/1990 | Sitch |
| 5,946,176 | A | 8/1999 | Ghoshal |
| 9,171,832 | B2* | 10/2015 | Salcedo .............. H01L 29/7436 |
| 2010/0123984 | A1 | 5/2010 | Lin |
| 2019/0089150 | A1* | 3/2019 | Gharibdoust ........... H01F 29/02 |

FOREIGN PATENT DOCUMENTS

| CN | 101958538 A | 1/2011 |
| CN | 205212423 U | 5/2016 |
| EP | 0 607 875 A1 | 7/1994 |
| TW | 388128 | 4/2000 |
| TW | 407349 | 10/2000 |
| TW | 201115712 A1 | 5/2011 |

* cited by examiner

*Primary Examiner* — Dharti H Patel

(57) ABSTRACT

An over current protection system includes a first resistor, a second resistor, a third resistor, and an electrostatic discharge circuit. The first resistor includes a first terminal for receiving an input voltage, and a second terminal. The second resistor includes a first terminal coupled to the second terminal of the first resistor, and a second terminal coupled to a ground terminal. The third resistor includes a first terminal, and a second terminal coupled to the first terminal of the second resistor. The electrostatic discharge circuit is coupled to the first terminal of the third resistor. When the input voltage is an abnormal voltage, the electrostatic discharge circuit is enabled for maintaining a voltage at the second terminal of the third resistor within a normal voltage range.

6 Claims, 4 Drawing Sheets

OVER CURRENT PROTECTION SYSTEM HAVING HIGH OPERATIONAL ENDURANCE AND CAPABLE OF STABILIZING VOLTAGES

BACKGROUND OF THE INVENTION

1. Field of the Invention

The present invention relates to an over current protection system, and more particularly, an over current protection system having high operational endurance and capable of stabilizing voltages.

2. Description of the Prior Art

With advancements of technologies and more demanding user requirements of multi-functional electronic devices, numerous input/output (I/O) endpoints or connecting components are also introduced recently. The I/O endpoints and connecting components can be used for receiving external driving voltages or control voltages. Therefore, they can be regarded as conductors for providing electrostatic discharge paths from external high electrostatic energy sources into internal circuits. Electrostatic discharge (ESD) is a physical phenomenon of charge transfer caused by objects with different electrostatic potentials approaching or directly contacting each other. Electrostatic energy can be generated by contacting, relatively moving, or rubbing one substance against another. Therefore, two objects become a positive electrostatic energy source and a negative electrostatic energy source. According to charge neutralization principle, when the positive electrostatic energy source and the negative electrostatic energy source are present, an electrostatic current is generated for transferring energy from positive electrostatic energy source to the negative electrostatic energy source. When the electrostatic current is generated, an extremely high voltage, an extremely high current, and an extremely high electromagnetic field may be also introduced. Therefore, some fragile objects or electronic components may be destroyed.

SUMMARY OF THE INVENTION

In an embodiment of the present invention, an over current protection system is disclosed. The over current protection system includes a first resistor, a second resistor, a third resistor, and an electrostatic discharge circuit. The first resistor includes a first terminal and a second terminal. The first terminal of the first resistor is configured to receive an input voltage. The second resistor includes a first terminal and a second terminal. The first terminal of the second resistor is coupled to the second terminal of the first resistor. The second terminal of the second resistor is coupled to a ground terminal. The third resistor includes a first terminal and a second terminal. The second terminal of the third resistor is coupled to the first terminal of the second resistor. The electrostatic discharge circuit is coupled to the first terminal of the third resistor. When the input voltage is an abnormal voltage, the electrostatic discharge circuit is enabled for maintaining a voltage at the second terminal of the third resistor within a normal voltage range.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
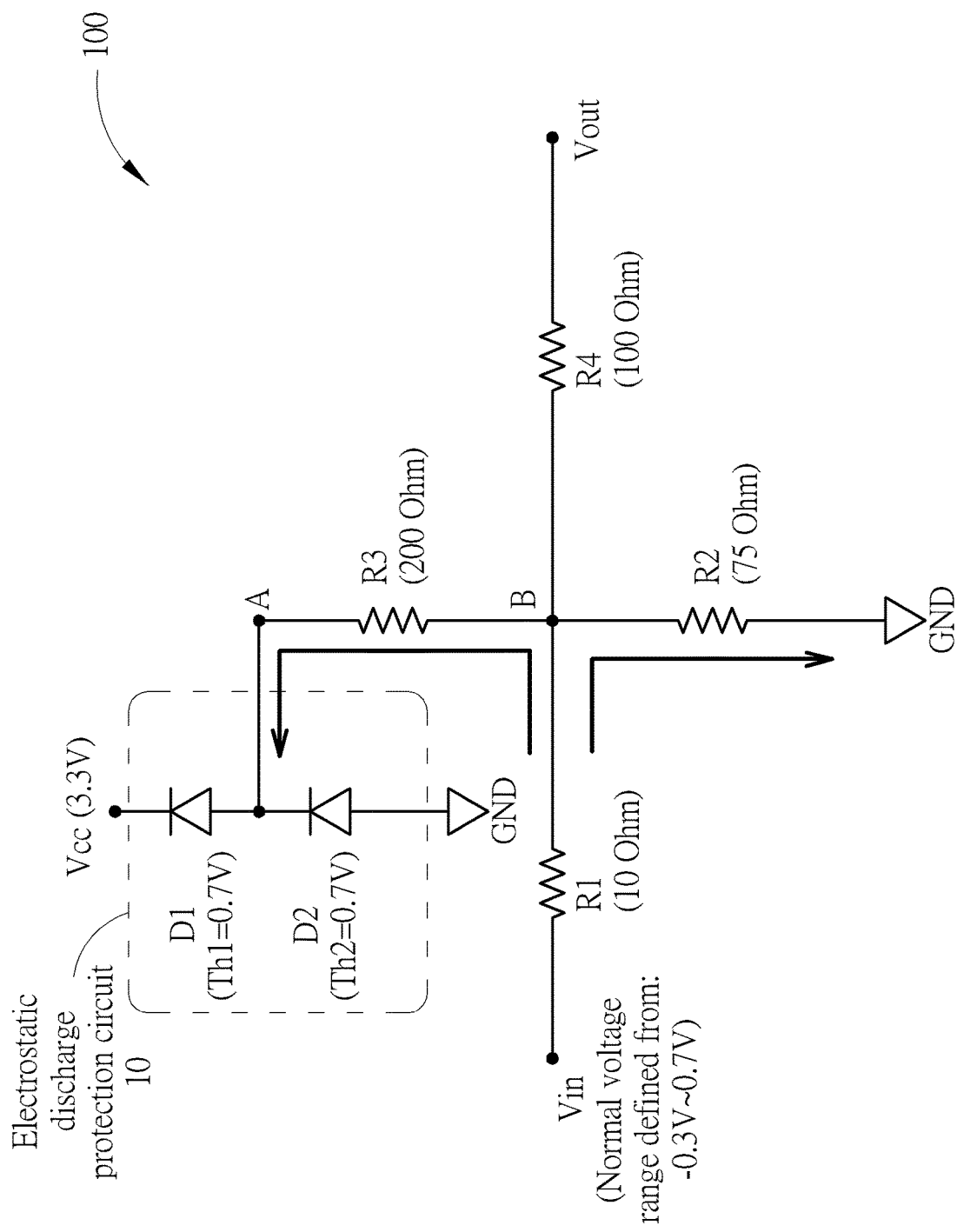
FIG. 1 is a circuit structure of an over current protection system according to an embodiment of the present invention.

FIG. 1 is a circuit structure 100 of an over current protection system according to an embodiment of the present invention. The over current protection system 100 can be applied to protect any electronic component, such as a processor disposed inside a display, a motherboard disposed inside a computer, or an electronic chip disposed inside a smart phone. Any reasonable application of the over current protection system 100 falls into the scope of the present invention. The over current protection system 100 includes a first resistor R1, a second resistor R2, a third resistor R3, a fourth resistor R4, and an electrostatic discharge protection circuit 10. The first resistor R1 includes a first terminal for receiving an input voltage Vin, and a second terminal. The second resistor R2 includes a first terminal coupled to the second terminal of the first resistor R1, and a second terminal coupled to a ground terminal GND. The third resistor R3 includes a first terminal, and a second terminal coupled to the first terminal of the second resistor R2. The fourth resistor R4 includes a first terminal coupled to the second terminal of the third resistor R3, and a second terminal for generating an output voltage Vout. The electrostatic discharge protection circuit 10 is coupled to the first terminal of the third resistor R3 for providing an additional current leakage path when the input voltage Vin is abnormal. In the over current protection system 100, the input voltage Vin may include a three-primary-colors pixel driving voltage (i.e., such as a D-Sub port voltage for driving RGB pixels), a horizontal synchronous signal voltage, a vertical synchronous signal voltage, an inter-integrated circuit ($I^2C$) data line (i.e., a serial data line, SDA) voltage or a clock line (i.e., a serial clock line, SCL) voltage, or a cable detection voltage. The input voltage Vin can be generated by a signal source. Since the input voltage Vin can be a voltage at a port terminal, a bonding pad terminal, or any contactable metal terminal, the input voltage Vin may be greatly fluctuated due to electrostatic discharge energy or abnormal output energy of the signal source. For example, a "normal" input voltage Vin can be defined within a voltage range from −0.3 volts to 0.7 volts. However, if high electrostatic discharge energy is introduced to the first terminal of the first resistor R1, the input voltage Vin may fluctuate within a voltage ranging from a couple of tens volts to hundreds of volts. Therefore, if the over current protection system 100 is absent, the processor of the display driven by the output voltage Vout may be damaged or burned since the input voltage Vin is extremely high. In the over current protection system 100, when the input voltage Vin has an abnormal voltage, the electrostatic discharge protection circuit 10 is operated under an enabling state. Therefore, a voltage at the second terminal (i.e., a node B) of the third resistor R3 can be maintained within the normal voltage range. In other words, the output voltage Vout of the over current protection system 100 can be regarded as a driving voltage of the processor of the display. When the input voltage Vin has the abnormal voltage, since the electrostatic discharge protection circuit 10 is enabled, a current path from the first resistor R1 to the electrostatic discharge protection circuit 10 and a current path from the first resistor R1 to the ground terminal GND are generated. Therefore, high input energy can be discharged by using the two current paths. Therefore, the voltage at the node B can be maintained within the normal voltage range. Moreover, the fourth resistor R4 can be regarded as a current limiting resistor. Thus, a voltage fluctuation of the output voltage Vout is smaller than the voltage at the node B. Therefore, electronic components driven by using the output voltage Vout can be protected from the electrostatic discharge energy or the abnormal input energy generated by the signal source.

In the over current protection system 100, the electrostatic discharge protection circuit 10 may include a first diode D1 and a second diode D2. The first diode D1 includes an anode coupled to the first terminal of the third resistor R3, and a cathode for receiving a power supply voltage Vcc. The second diode D2 includes an anode coupled to the ground terminal GND, and a cathode coupled to the anode of the first diode D1. Further, the first diode D1 has a first threshold voltage Th1. The second diode D2 has a second threshold voltage Th2. The first threshold voltage Th1 and the second threshold voltage Th2 can be identical or different. For example, the power supply voltage Vcc can be 3.3 volts. The first threshold voltage Th1 can be 0.7 volts. The second threshold voltage Th2 can be 0.7 volts. In other words, the first diode D1 is turned on when a voltage difference between the anode and cathode is greater than the first threshold voltage Th1. Similarly, the second diode D2 is turned on when a voltage difference between the anode and the cathode is greater than the second threshold voltage Th2. Further, configurations of the electrostatic discharge protection circuit 10 are not limited to FIG. 1. The electrostatic discharge protection circuit 10 can include more than two diodes. The electrostatic discharge protection circuit 10 can also include only a single diode. At least one diode of the electrostatic discharge protection circuit 10 may include a Zener diode or any electronic device capable of performing a current limiting function or a voltage limiting function. Any reasonable hardware modification falls into the scope of the present invention.

In the over current protection system 100, the first resistor R1, the second resistor R2, the third resistor R3, and the fourth resistor R4 can be variable resistors. A user can adjust a resistance value of at least one resistor according to actual requirements. For example, a first resistance value of the first resistor R1, a second resistance value of the second resistor R2, a third resistance value of the third resistor R3, and a fourth resistance value of the fourth resistor R4 can be adjusted according to a normal voltage range of the input voltage Vin and/or a predefined voltage range of the output voltage Vout. In FIG. 1, when the normal voltage range of the input voltage Vin is defined as from −0.3 volts to 0.7 volts, the first resistance value can be set to 10 Ohms, the second resistance value can be set to 75 Ohms, the third resistance value can be set to 200 Ohms, and the fourth resistance value can be set to 100 Ohms. Further, in FIG. 1, when the second resistance value (75 Ohms) of the second resistor R2 is smaller than the third resistance value (200 Ohms) of the third resistor R3, it implies that a large part of energy of the abnormal input voltage Vin can be leaked out through the second resistance R2. Further, when the second resistance value of the second resistor R2 is smaller than the third resistance value of the third resistor R3, the second resistor is larger than the third resistor. For example, the second resistor R2 can be manufactured according to a body size of 1/4 watt (W) or a body size of 1/10 watt (W) . A specification type of the second resistor R2 can be 1206 or 0603. Moreover, the fourth resistor R4 in the over current protection system 100 can also be omitted. In other words, when an electronic component is directly coupled to the node B, even if no fourth resistor R4 is introduced, the over current protection system 100 can also provide an over current protection function. However, when the electronic component is coupled to the second terminal of the fourth resistor R4, the fourth resistor R4 can be regarded as a current limiting component. Therefore, by introducing the fourth resistor R4, the over current protection system 100 can provide a complete over current protection function. Moreover, when the input voltage Vin is the abnormal voltage, the third resistor R3 can be used for limiting a current inputted to the electrostatic discharge protection circuit 10, thereby increasing durability (or say, operational endurance) of the electrostatic discharge protection circuit 10. In an endurance testing stage, the third resistance value of the third resistor R3 can be set to 200 Ohms. The input voltage Vin can be set to an abnormally high voltage such as 70 volts, and is boosted four times. After the electrostatic discharge protection circuit 10 receives the abnormally high voltage Vin four times, all electronic characteristics and linearity of the diodes are still stable. However, if the third resistor R3 is removed, under the same testing conditions, the electrostatic discharge protection circuit 10 may malfunction due to the damage of the diodes. Therefore, in the over current protection system 100, the third resistor R3 can be used for increasing the durability of the electrostatic discharge protection circuit 10.

Figure 2:
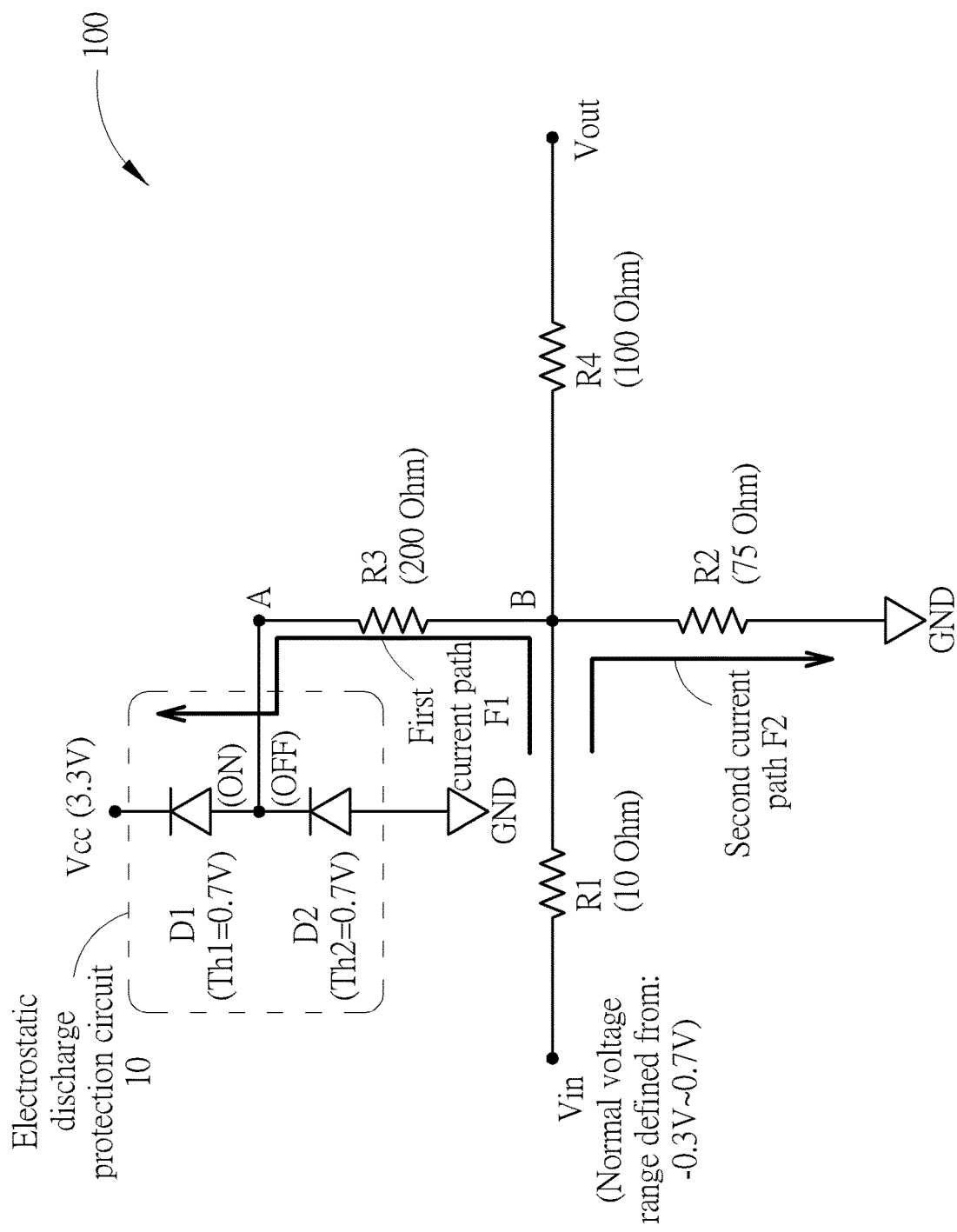
FIG. 2 is an illustration of circuit component statuses and current paths of the over current protection system in FIG. 1 when an input voltage is an abnormally high positive voltage.

FIG. 2 is an illustration of circuit component statuses and current paths of the over current protection system 100 when the input voltage Vin is an abnormally high positive voltage. As previously mentioned, the electrostatic discharge protection circuit 10 in the over current protection system 100 can include the first diode D1 and the second diode D2. The first diode D1 has the first threshold voltage Th1. The second diode D2 has the second threshold voltage Th2. Therefore, for the first diode D1, a condition of conducting (i.e., or say, turning on) the first diode D1 satisfies VA−Vcc>Th1. In other words, when a voltage VA at the first terminal (i.e., a node A) of the third resistor D3 is greater than a sum of the power supply voltage Vcc and the first threshold voltage Th1 (i.e., VA>Vcc+Th1), the first diode D1 is conductive. Then, the first resistor R1, the third resistor R3, and the first diode D1 form a first current path F1. The second diode D2 is operated under a disabling state. For the first current path F1, a current is transmitted through the first resistor R1, the third resistor R3, and the first diode D1 sequentially. Further, the first resistor R1 and the second resistor R2 form a second current path F2. For the second current path F2, a current is transmitted through the first resistor R1 and the second resistor R2 sequentially. The over current protection system 100 can use the first current path F1 and the second current path F2 for maintaining the voltage at the second terminal (i.e., the node B) of the third resistor R3 within the normal voltage range. Since the voltage at the node B is maintained within the normal voltage range, the output voltage Vout can also be maintained within the normal voltage range. In FIG. 2, the normal voltage range of the input voltage Vin is defined from −0.3 volts to 0.7 volts. The power supply voltage Vcc is 3.3 volts. The first threshold voltage Th1 is 0.7 volts. The second threshold voltage Th2 is 0.7 volts. Therefore, when the voltage VA of the node A is greater than 3.3+0.7=4 volts, the first diode D1 is turned on. In other words, when the positive input voltage Vin is abnormally high and the voltage VA of the node A is greater than 4 volts, the electrostatic discharge protection circuit 10 can generate the first current path F1. Therefore, the over current protection system 100 can use the first current path F1 and the second current path F2 for maintaining the voltage of the node B and the output voltage Vout within the normal voltage range defined from −0.3 volts to 0.7 volts. Thus, although the input voltage Vin may be abnormal due to an abnormal fluctuation of the electrostatic discharge energy or an abnormal fluctuation of the external energy source, the over current protection system 100 can adjust the abnormal input voltage Vin caused by the electrostatic discharge energy and/or the abnormal external inputted energy. Therefore, the electronic component (i.e., such as the processor in the display) driven by using the output voltage Vout of the over current protection system 100 can be protected.

Figure 3:
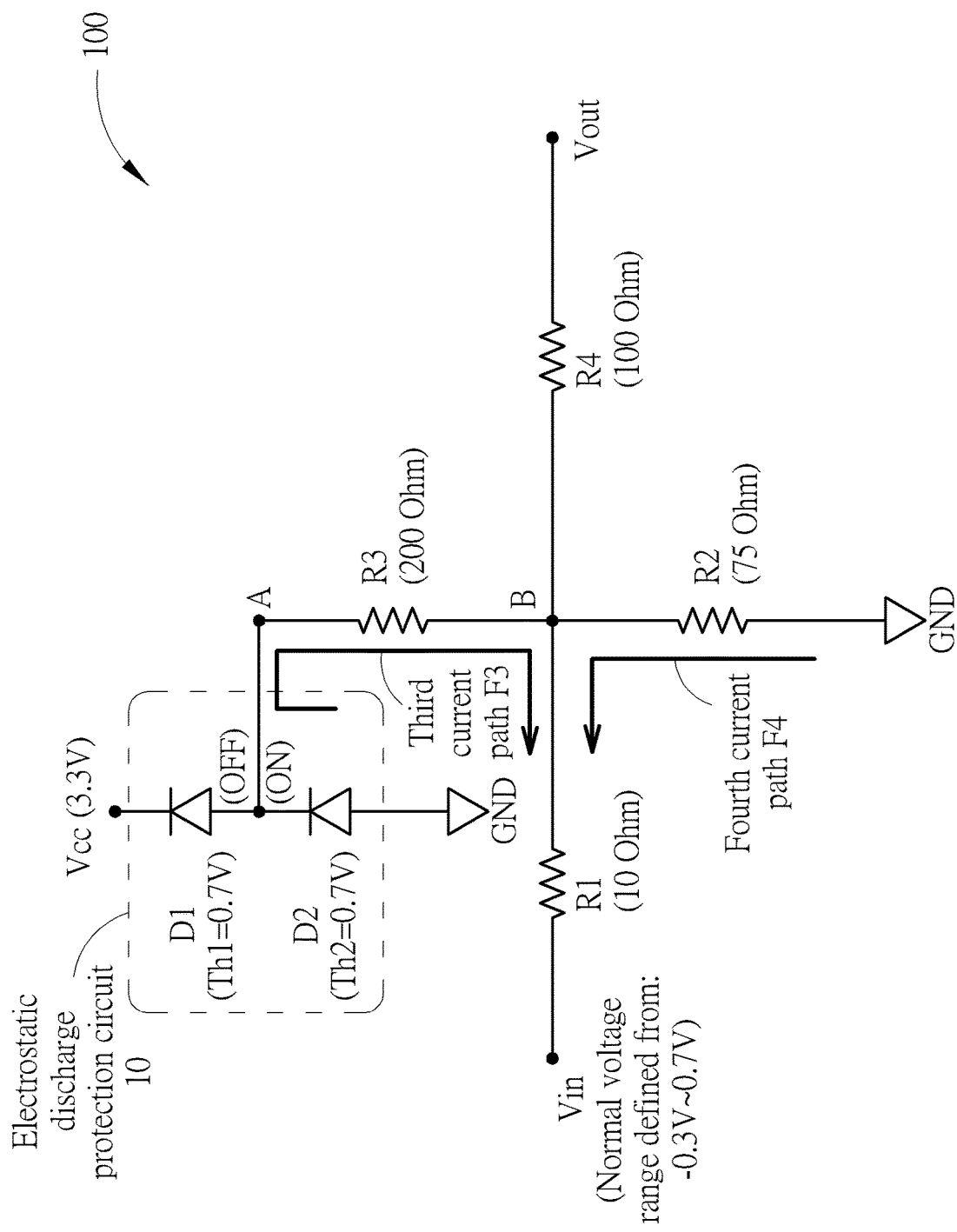
FIG. 3 is an illustration of circuit component statuses and current paths of the over current protection system in FIG. 1 when the input voltage is an abnormally low negative voltage.

FIG. 3 is an illustration of circuit component statuses and current paths of the over current protection system 100 when the input voltage Vin is an abnormally low negative voltage. As previously mentioned, the electrostatic discharge protection circuit 10 in the over current protection system 100 can include the first diode D1 and the second diode D2. The first diode D1 has the first threshold voltage Th1. The second diode D2 has the second threshold voltage Th2. Therefore, for the second diode D2, a condition of conducting the second diode D2 satisfies 0−VA>Th2. In other words, when the voltage VA at the first terminal (i.e., the node A) of the third resistor R3 is smaller than a negative value of the second threshold voltage Th2 (i.e., VA<−Th2), the second diode D2 is conductive. Then, the first resistor R1, the third resistor R3, and the second diode D2 form a third current path F3. The first diode D1 is operated under the disabling state. For the third current path F3, a current is transmitted through the second diode D2, the third resistor R3, and the first resistor R1 sequentially. Further, the first resistor R1 and the second resistor R2 form a fourth current path F4. For the fourth current path F4, a current is transmitted through the second resistor R2 and the first resistor R1 sequentially. The over current protection system 100 can use the third current path F3 and the fourth current path F4 for maintaining the voltage at the second terminal (i.e., the node B) of the third resistor R3 within the normal voltage range. Since the voltage at the node B is maintained within the normal voltage range, the output voltage Vout can also be maintained within the normal voltage range. In FIG. 3, the normal voltage range of the input voltage Vin is defined from −0.3 volts to 0.7 volts. The power supply voltage Vcc is 3.3 volts. The first threshold voltage Th1 is 0.7 volts. The second threshold voltage Th2 is 0.7 volts. Therefore, when the voltage VA of the node A is smaller than −0.7 volts, the second diode D2 is turned on. In other words, when the negative input voltage Vin is abnormally low and the voltage of the node A is smaller than −0.7 volts, the electrostatic discharge protection circuit 10 can generate the third current path F3. Therefore, the over current protection system 100 can use the third current path F3 and the fourth current path F4 for maintaining the voltage of the node B and the output voltage Vout within the normal voltage range defined from −0.3 volts to 0.7 volts. Thus, although the input voltage Vin may be abnormal due to an abnormal fluctuation of the electrostatic discharge energy or an abnormal fluctuation of the external energy source, the over current protection system 100 can adjust the abnormal input voltage Vin caused by the electrostatic discharge energy and/or the abnormal external inputted energy. Therefore, the electronic component (i.e., such as the processor in the display) driven by using the output voltage Vout of the over current protection system 100 can be protected.

Figure 4:
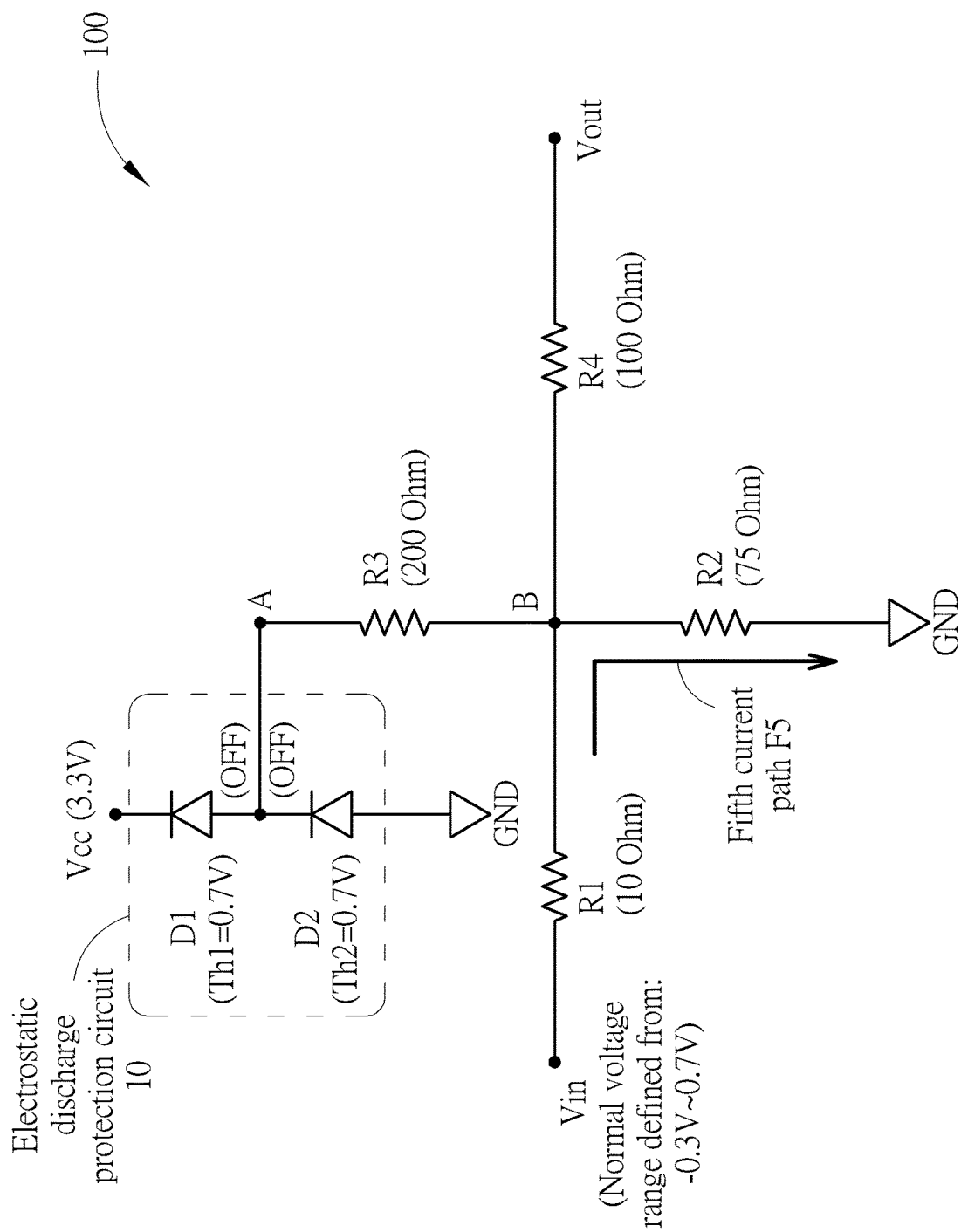
FIG. 4 is an illustration of circuit component statuses and current paths of the over current protection system in FIG. 1 when the input voltage is detected within a normal voltage range.

FIG. 4 is an illustration of circuit component statuses and current paths of the over current protection system 100 when the input voltage is detected within the normal voltage range. As previously mentioned, in the electrostatic discharge protection circuit 10 of the over current protection system 100, the condition of conducting the first diode D1 satisfies VA>Vcc+Th1. The condition of conducting the second diode D2 satisfies VA<−Th2. In other words, when the voltage VA at the node A falls into a voltage range of −Th2≤VA≤Vcc+Th1, the input voltage falls into the normal voltage range. Conversely, when the voltage VA at the node A is generated outside the voltage range of −Th2≤TA≤Vcc+Th1, the input voltage is abnormal. In the over current protection system 100, when the input voltage falls into the normal voltage range, the first diode D1 and the second diode D2 in the electrostatic discharge protection circuit 10 are operated under the disabling state. Therefore, the first current path F1 in FIG. 2 or the third current path F3 in FIG. 3 is absent. As shown in FIG. 4, in the over current protection system 100, when the input voltage falls into the normal voltage range, only the fifth current path F5 is generated for discharging a small amount of input energy. Further, the first resistor R1 and the second resistor R2 can be regarded as a voltage divider circuit. Therefore, when the input voltage Vin falls within the normal voltage range, the voltage at the node B can be expressed as [R2/(R1+R2)]× Vin. As previous configurations of resistance values, the first resistance value of the first resistor R1 can be 10 Ohms. The second resistance value of the second resistor R2 can be 75 Ohms. The voltage at node B can be derived as (75/85)×Vin, such as 0.882×Vin. In other words, when the voltage VA (i.e., the voltage at the node A) at the first terminal of the third resistor R3 is between the negative value of the second threshold voltage (i.e., −Th2) and the sum of the power supply voltage Vcc and the first threshold voltage Th1, the first diode D1 and the second diode D2 are disabled. The voltage at the second terminal (i.e., at the node B) of the third resistor R3 is substantially equal to the input voltage Vin, such as 0.882×Vin. In other words, the user can adjust the first resistance value of the first resistor R1 and the second resistance value of the second resistor R2 according to actual requirements so that the voltage at the node B is substantially equal to the input voltage Vin.

To sum up, the present invention discloses an over current protection system capable of protecting the electronic components from the electrostatic discharge energy and the abnormal inputted energy. When an input voltage of the over current protection system is abnormal, an electrostatic discharge protection circuit of the overcurrent protection system is enabled. The over current protection system can generate two current paths for discharging abnormal energy in order to maintain an output voltage within the normal voltage range. When the input voltage of the over current protection system is normal, the electrostatic discharge protection circuit of the over current protection system is disabled. The output voltage is substantially equal to the input voltage. Further, since the over current protection system introduces a third resistor coupled to the electrostatic discharge protection circuit, the current passing through the electrostatic discharge protection circuit can be limited, increasing operational endurance of the electrostatic discharge protection circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An over current protection system comprising:
   a first resistor comprising:
      a first terminal configured to receive an input voltage; and
      a second terminal;
   a second resistor comprising:
      a first terminal coupled to the second terminal of the first resistor; and
      a second terminal coupled to a ground terminal;
   a third resistor comprising:
      a first terminal; and
      a second terminal coupled to the first terminal of the second resistor;
   a fourth resistor comprising:
      a first terminal coupled to the second terminal of the third resistor; and
      a second terminal configured to generate an output voltage; and
   an electrostatic discharge circuit coupled to the first terminal of the third resistor;
   wherein the first resistor, the second resistor, the third resistor, and the fourth resistor are variable resistors,
      a first resistance value of the first resistor, a second resistance value of the second resistor, a third resistance value of the third resistor are adjusted according to a normal voltage range of the input voltage and/or a predefined voltage range of the output voltage,
      and when the input voltage is an abnormal voltage, the electrostatic discharge circuit is enabled for maintaining a voltage at the second terminal of the third resistor within a normal voltage range.

2. The system of claim 1, wherein when the input voltage is a normal voltage, the electrostatic discharge circuit is disabled, and the voltage at the second terminal of the third resistor is substantially equal to the input voltage.

3. An over current protection system comprising:
   a first resistor comprising:
      a first terminal configured to receive an input voltage; and
      a second terminal;
   a second resistor comprising:
      a first terminal coupled to the second terminal of the first resistor; and
      a second terminal coupled to a ground terminal;
   a third resistor comprising:
      a first terminal; and
      a second terminal coupled to the first terminal of the second resistor; and
   an electrostatic discharge circuit coupled to the first terminal of the third resistor, the electrostatic discharge circuit comprising:
      a first diode comprising:
         an anode coupled to the first terminal of the third resistor; and
         a cathode configured to receive a power supply voltage; and
      a second diode comprising:
         an anode coupled to the ground terminal; and
         a cathode coupled to the anode of the first diode;
   wherein the first resistor, the second resistor, and the third resistor are variable resistors, a first resistance value of the first resistor, a second resistance value of the second resistor, a third resistance value of the third resistor are adjusted according to a normal voltage range of the input voltage and/or a predefined voltage range of an output voltage, the first diode has a first threshold voltage, the second diode has a second threshold voltage, when the input voltage is an abnormal voltage, the electrostatic discharge circuit is enabled for maintaining a voltage at the second terminal of the third resistor within a normal voltage range, when a voltage at the first terminal of the third resistor is greater than a sum of the power supply voltage and the first threshold voltage, the first diode is conductive, and when the voltage at the first terminal of the third resistor is smaller than a negative value of the second threshold voltage, the second diode is conductive; and
   wherein when the voltage at the first terminal of the third resistor is greater than a sum of the power supply voltage and the first threshold voltage, the first resistor, the third resistor, and the first diode form a first current path, the first resistor and the second resistor form a second current path, and the first current path and the second current path are configured to maintain the voltage at the second terminal of the third resistor within the normal voltage range.

4. An over current protection system comprising:
   a first resistor comprising:
      a first terminal configured to receive an input voltage; and
      a second terminal;
   a second resistor comprising:
      a first terminal coupled to the second terminal of the first resistor; and
      a second terminal coupled to a ground terminal;
   a third resistor comprising:
      a first terminal; and
      a second terminal coupled to the first terminal of the second resistor; and
   an electrostatic discharge circuit coupled to the first terminal of the third resistor, the electrostatic discharge circuit comprising:
      a first diode comprising:
         an anode coupled to the first terminal of the third resistor; and
         a cathode configured to receive a power supply voltage; and
      a second diode comprising:
         an anode coupled to the ground terminal; and
         a cathode coupled to the anode of the first diode;
   wherein the first resistor, the second resistor, and the third resistor are variable resistors, a first resistance value of the first resistor, a second resistance value of the second resistor, a third resistance value of the third resistor are adjusted according to a normal voltage range of the input voltage and/or a predefined voltage range of an output voltage, the first diode has a first threshold voltage, the second diode has a second threshold voltage, when the input voltage is an abnormal voltage, the electrostatic discharge circuit is enabled for maintaining a voltage at the second terminal of the third resistor within a normal voltage range, when a voltage at the first terminal of the third resistor is greater than a sum of the power supply voltage and the first threshold voltage, the first diode is conductive, and when the voltage at the first terminal of the third resistor is smaller than a negative value of the second threshold voltage, the second diode is conductive; and wherein when the voltage at the first terminal of the third resistor is smaller than the negative value of the second threshold voltage, the first resistor, the third resistor, and the second diode form a third circuit path, the first resistor and the second resistor form a fourth current path, the third circuit path and the fourth circuit path are configured to maintain the voltage at the second terminal of the third resistor within the normal voltage range, or when the voltage at the first terminal of the third resistor is between the negative value of the second threshold voltage and the sum of the power supply voltage and the first threshold voltage, the first diode and the second diode are disabled, and the voltage at the second terminal of the third resistor is substantially equal to the input voltage.

5. The system of claim 4, wherein when a second resistance value of the second resistor is smaller than a third resistance value of the third resistor, the second resistor is larger than the third resistor.

6. The system of claim 4, wherein the input voltage comprises a primary-color driving voltage of a video terminal, a horizontal synchronization signal voltage, a vertical synchronization signal voltage, a serial data signal voltage and/or a serial data clock signal voltage of an inter-integrated circuit ($I^2C$).

* * * * *